United States Patent [19]

Evans

[11] Patent Number: 5,280,290

[45] Date of Patent: Jan. 18, 1994

[54] SELF-OSCILLATING MIXER CIRCUITS, AND FMCW RADAR

[75] Inventor: David H. Evans, Crawley, England

[73] Assignee: U.S. Philips Corporation, New York, N.Y.

[21] Appl. No.: 960,678

[22] Filed: Oct. 14, 1992

[30] Foreign Application Priority Data

Oct. 21, 1991 [GB] United Kingdom ............... 9122313

[51] Int. Cl.⁵ ........................ G01S 13/08; H04B 1/26
[52] U.S. Cl. .................................... 342/128; 455/321
[58] Field of Search ............... 342/128, 122; 455/321, 455/333, 325; 331/117

[56] References Cited

U.S. PATENT DOCUMENTS

| | | |
|---|---|---|
| 3,787,854 | 1/1974 | Friedman et al. |
| 3,832,709 | 8/1974 | Klein et al. |
| 3,896,435 | 7/1975 | Constant ............... 342/109 |
| 4,219,779 | 8/1980 | Shinkawa et al. |
| 4,682,175 | 7/1987 | Lazarus. |
| 4,857,935 | 8/1989 | Bates ............... 342/122 X |

FOREIGN PATENT DOCUMENTS

| | | |
|---|---|---|
| 0118342 | 2/1984 | European Pat. Off. |
| 2816586 | 11/1978 | Fed. Rep. of Germany. |
| 52-7688 | 1/1977 | Japan. |
| 52-95996 | 12/1977 | Japan. |

Primary Examiner—Mark Hellner
Attorney, Agent, or Firm—Robert J. Kraus

[57] ABSTRACT

A simple self-oscillating mixer circuit is provided, suitable for forming with an antenna (21) the complete front end of an inexpensive short-range FMCW radar. A modulating signal (40), e.g. from a sweep generator (44), is applied to a control terminal (14) to sweep the RF output (R) of the self-oscillating mixer SOM (10). A cancellation circuit (6 to 9) is connected between the control terminal (14) and an IF output line (13) to remove a corresponding modulation (41) which occurs on the IF line (13) and so to generate a substantially demodulated IF output signal (I). Advantageously a grounded-source MESFET in a feed-back network forms the SOM (10) and has the IF output line (13) taken from its gate. In this case the IF modulation (41) is inverted with respect to the modulating signal (40), and so the cancellation is achieved by adding the modulating signal (40) to the modulated IF output signal (41), e.g. via a resistor network 6 to 8.

8 Claims, 1 Drawing Sheet

SELF-OSCILLATING MIXER CIRCUITS, AND FMCW RADAR

BACKGROUND OF THE INVENTION

This invention relates to self-oscillating mixer circuits for converting an R-F (radio frequency) signal to an IF (intermediate frequency) signal, particularly but not exclusively self-oscillating mixer circuits suitable for use as the front end of a frequency-modulated continuous-wave (FMCW) short-range radar. The invention also provides a simple frequency-modulated radar comprising such a self-oscillating mixer circuit, for example an inexpensive short-range FMCW radar suitable for use in cars or other vehicles for collision avoidance purposes or speedometer applications.

Self-oscillating mixer circuits for converting an RF signal to an IF signal are known, comprising an RF oscillator having an RF line, a common terminal and an IF line; the RF line serves for transmitting RF signals to and from the oscillator, and the IF line serves for deriving from the oscillator an IF signal which results from the mixing of the RF signals in the oscillator. U.S. Pat. No. 4 219 779 describes one such known self-oscillating mixer circuit in which the RF oscillator is formed by a field-effect transistor connected in a feed-back path. In this known circuit the IF line is connected to the drain of the transistor; the RF line is connected to either the gate or the source, depending on whether a common source configuration or common gate configuration is used in the circuit.

The whole contents of U.S. Pat. No. 4 219 779 are hereby incorporated herein as reference material. In accordance with the teaching in U.S. Pat. No. 4 219 779, a dielectric resonator is coupled to the RF line in order to improve the stability of the oscillator frequency and to suppress leakage of a local oscillator frequency into the RF line input.

SUMMARY OF THE INVENTION

It is an aim of the present invention to provide a self-oscillating mixer circuit which permits the RF signal from the oscillator to be modulated while deriving a substantially demodulated IF signal in a comparatively simple and inexpensive manner. It is a further aim of the present invention to provide such a mixer circuit with which only a few additional components need to be combined in order to assemble a simple frequency-modulated radar.

According to one aspect of the present invention, there is provided a self-oscillating mixer circuit for converting an RF (radio frequency) signal to an IF (intermediate frequency) signal, comprising an RF oscillator having an RF line, a common terminal and an IF line, in which the RF line serves for transmitting RF signals to and from the oscillator, and the IF line serves for deriving from the oscillator an IF signal which results from the mixing of the RF signals in the oscillator. In accordance with the invention, such a circuit is characterised by comprising a control terminal for applying to the oscillator a modulating signal for modulating the RF signal from the oscillator, a corresponding modulation occurring in the IF signal from the oscillator, and cancellation means is connected between the control terminal and the IF line for combining the modulating signal with the modulated IF signal to generate a substantially demodulated IF output signal.

According to another aspect of the present invention, there is provided a frequency-modulated continuous-wave radar comprising in combination (a) an antenna, (b) a sweep-waveform generator, and (c) a mixer circuit in accordance with the invention, the sweep-waveform generator being connected to the control terminal to supply the modulating signal for frequency sweeping the radar, and the antenna being connected to the RF line.

The RF oscillator may be formed in a simple and known manner by a transistor connected in a feed-back path. Depending on its circuit configuration, this transistor may also invert the corresponding modulation in the IF signal derived from the transistor. A bipolar transistor may be used. However, especially at millimeter wavelengths, better microwave performance can be obtained when the transistor is a field-effect transistor connected in a feed-back path so as to form a voltage-controlled oscillator. The IF line may be connected to a gate of the field-effect transistor.

When the corresponding modulation in the IF signal from the oscillator is inverted with respect to the modulating signal, the cancellation means may comprise a summation circuit for adding the modulating signal to the modulated IF signal. When the modulation in the IF signal from the oscillator is not inverted, the cancellation means may comprise a subtraction circuit for subtracting the modulating signal from the modulated IF signal.

The modulating signal may be applied as a varying bias signal to the oscillator. The control terminal may be a bias terminal of the oscillator and so the modulating bias signal may be applied directly to the oscillator, for example by a connection to its RF line. However, in this case some coupling back of the IF signal to the control terminal may occur through the oscillator; this may be undesirable, depending on the source means used to generate the modulating signal. In order to avoid or to reduce this effect, it is advantageous to provide between the R-F line of the oscillator and the control terminal a buffer in the form of a modulator which is connected between a bias supply line and the oscillator and which has a control electrode connected to the control terminal of the circuit for modulating the bias signal to the oscillator. In this case, when the oscillator is formed by a field-effect transistor having the IF line connected to its gate, the modulator may be connected between a bias voltage supply line and a source or drain of the transistor. A convenient modulator can be formed by an emitter-follower transistor having its emitter region connected to the source or drain of the field-effect transistor. Such an emitter-follower configuration of a bipolar tranistor provides a suitable low impedance drive to the FET oscillator. Alternatively a field-effect transistor may be used to form the modulator buffer. The modulator transistor (whether bipolar or FET) is a general purpose low frequency device, whereas the oscillator transistor (whether bipolar or FET) is an RF device.

BRIEF DESCRIPTION OF THE DRAWING

These and other features in accordance with the present invention are illustrated specifically in embodiments of the invention now to be described, by way of example, with reference to the accompanying diagrammatic drawing figures which.

DESCRIPTION OF THE PREFERRED EMBODIMENT

Figure 1:
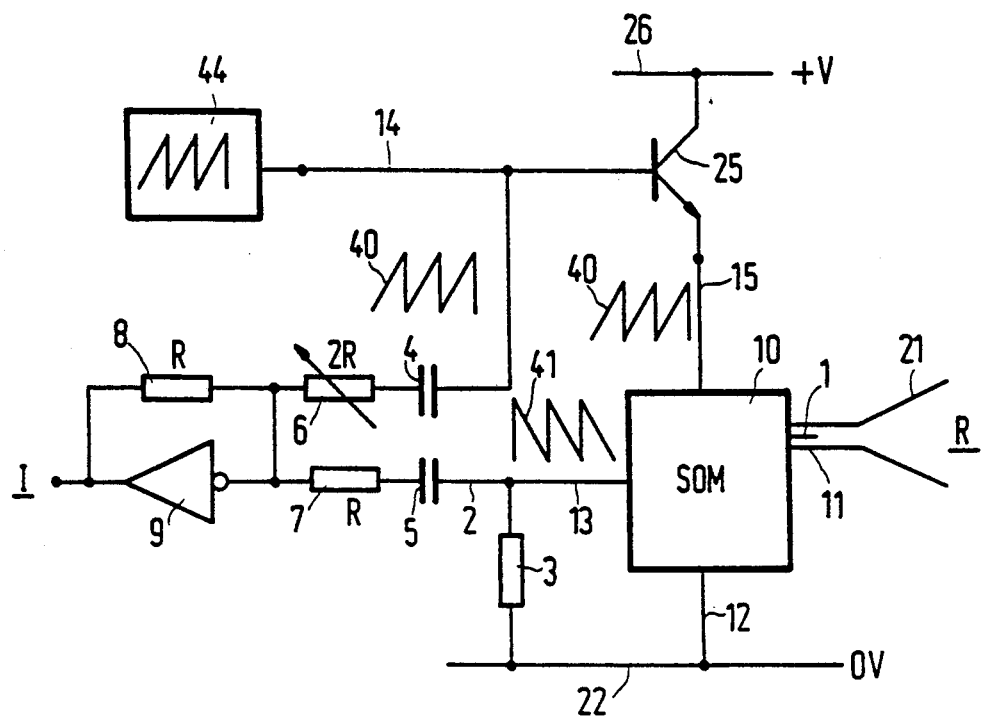
FIG. 1 is a circuit diagram of an FMCW radar in accordance with the invention and comprising one example of a self-oscillating mixer circuit in accordance with the invention.

The arrangement of FIG. 1 includes a self-oscillating mixer (SOM) circuit for converting an RF signal (e.g. at about 35 GHz) to an IF signal (e.g. at about 30 to 300 kHz when used as an FMCW radar). This circuit comprises an RF oscillator in the form of a self-oscillating mixer (SOM) 10 having an RF terminal 11, a common terminal 12 and an IF terminal 13. An RF line 1,21 (e.g. formed in microstrip and waveguide technology) is present at the RF terminal 11 for transmitting RF signals (R) to and from the oscillator. In the FMCW radar of FIG. 1, the RF microstrip line 1 feeds an RF antenna 21 of the radar. An IF line 2 is connected to the IF terminal 13 for deriving from the oscillator 10 the IF signal which results from the mixing of the RF signals in the oscillator.

In accordance with the present invention, the self-oscillating mixer circuit also comprises a control terminal 14 for applying to the SOM oscillator 10 a modulating bias signal 40 for modulating the RF frequency of the oscillator 10. The control terminal 14 is connected to the RF line 1. A corresponding modulation 41 occurs in the IF signal from the oscillator 10. Cancellation means in the form of a circuit 6 to 9 connected between the control terminal 14 and the IF line 2 serves to generate a substantially demodulated IF signal (I) from a linear combination of the modulated IF signal 41 and the modulating signal 40.

FIG. 1 also illustrates the assembly of a simple and inexpensive FMCW radar in accordance with the present invention. A sweep-waveform generator 44 is connected to the control terminal 14 to supply the modulating bias signal 40 for frequency sweeping the radar. The RF signals R are fed to and from an antenna 21 of the radar, coupled to the microstrip RF line 1.

Figure 2:
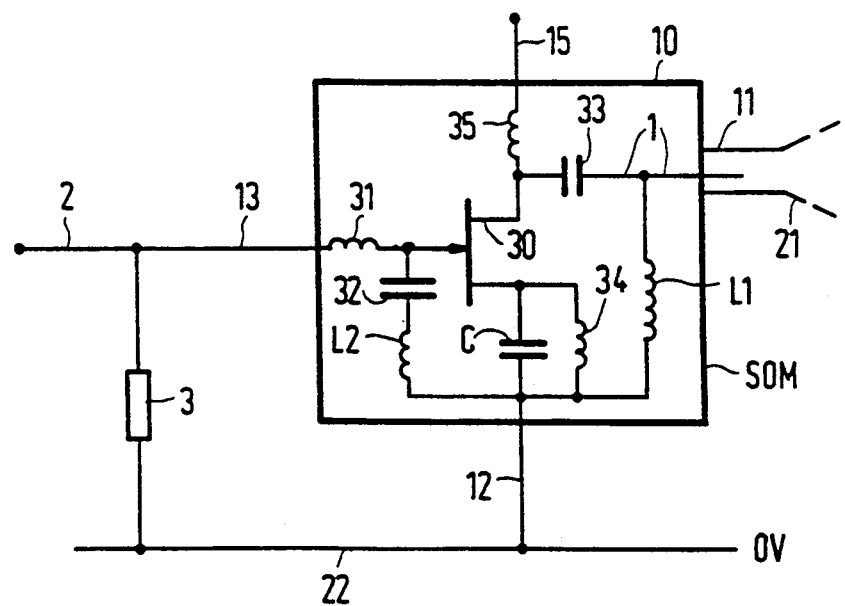
FIG. 2 is a circuit diagram of one example of a self-oscillating mixer (SOM) suitable for use in the circuit of FIG. 1.

FIG. 2 illustrates one advantageous form of SOM 10 comprising a MESFET (Schottky-gate field-effect transistor, for example of gallium arsenide) which is an RF device with a suitable tuning characteristic for the FMCW radar. The MESFET 30 may be utilised in a common-source configuration in two different arrangements, namely with the IF signal taken from either its drain bias electrode or its gate bias electrode. These two arrangements give different performances for the SOM 10. It seems preferable at present to use the gate output arrangement which appears to give better sensitivity and lower conversion loss. This gate output arrangement is illustrated in FIG. 2, in which the IF terminal 13 of the SOM 10 is taken from the gate of the MESFET 30 via an RF choke 31. A bias resistor 3 is connected between the IF terminal 13 and a ground line 22 to provide an appropriate gate bias level for the MESFET 30. A suitable negative bias voltage is developed across the resistor 3 due to self rectification at the Schottky gate of the MESFET 30.

In order to form an oscillator, the MESFET 30 is connected in a feed-back path with a network of inductors L1 and L2 and a capacitor C. The capacitor C is connected in series with the source of the MESFET 30 to provide positive feedback between the gate and drain of the MESFET 30. The frequency of oscillation is determined by the resonance of the inductor L2 with the gate capacitance. The source of the MESFET 30 is connected to the ground line 22 via an RF choke 34 which shunts the capacitor C. A dc blocking capacitor 32 is also included in the feedback path. Instead of this series feedback configuration for the MESFET 30, a parallel feedback path may be used by connecting the feedback capacitor C between the drain and gate of the MESFET 30. The inductor L1 provides an RF return path to the network and output impedance matching for the RF line 1. A dc blocking capacitor 33 is included in the microstrip RF line 1, between the drain electrode of the MESFET 30 and the inductor L1. The blocking capacitors 32 and 33 have sufficiently large capacitance values as to provide only a very low impedance at the RF frequencies. All the capacitors and inductors 31,32,33,C,L1 and L2 may be formed as circuit elements on a microstrip circuit substrate on which the FET 30 is mounted.

Since the SOM 10 is formed with a field-effect transistor 30, the varying signal 40 applied to modulate the RF frequency of the SOM is a bias voltage. This varying bias voltage 40 is applied to the drain electrode of the MESFET 30 from a bias voltage supply line 26, via a bias terminal 15 of the SOM 10. An RF choke 35 is present between the bias terminal 15 and the RF line I and drain of the transistor 30. In order to prevent coupling in the SOM 10 between the IF terminal 13 and the control terminal 14, the RF line I of the SOM 10 is isolated from the control terminal 14 and from the bias-voltage supply line 26 by a modulator in the form of an emitter-follower buffer 25. This emitter-follower buffer 25 is connected between the supply line 26 and the drain bias terminal 15 of the SOM 10 and has a control electrode to which the sweep waveform 40 from the generator 44 is applied via the control terminal 14. This emitter-follower buffer 25 is formed by a low frequency transistor which may be mounted and integrated together with the cancellation circuit 6 to 9 on the same substrate as the self-oscillating mixer 10.

FIGS. 1 and 2 illustrate circuit arrangements in which the corresponding modulation 41 in the IF signal from the oscillator 10 is inverted with respect to the modulating signal 40. This inversion is performed by the MESFET 30 in the common-source MESFET configuration of FIG. 2, because the modulating signal 40 is applied to the drain connection 15 and the IF beat frequency is taken out from the gate connection 13. In this situation with the corresponding modulation 41 in the IF signal having been inverted, a summation circuit 6 to 9 is used to cancel the modulation in the IF output.

FIG. 1 illustrates one particular form of summation circuit 6 to 9, comprising an amplifier 9 and a network of resistors 6,7,8. The modulated IF signal 41 on the IF line is applied to the resistor 7 via a dc blocking capacitor 5. The modulating bias signal 40 from the control terminal 14 is applied to the resistor 6 via a dc blocking capacitor 4. Resistors 7 and 8 are of the same resistance value R. Resistor 6 is of higher value (for example up to 2R) and is variable in order to permit the levels of the signals 40 and 41 in the summation circuit to be adjusted so as to be about the same. However, it will be evident that other circuits may be used in a self-oscillating mixer circuit in accordance with the invention, for adding the modulating signal to the modulated IF output signal 41 in order to produce a substantially demodulated IF output signal I. Depending on the circuit configuration and gain of a particular SOM 10 and on the particular source of the modulating signal 40, a circuit arrangement may be obtained in which the level of the inverted modulation 41 in the IF signal may be comparable with that of the modulating signal and in which a simple connection node between the control terminal 14 and the IF line 2 may be used to provide the summation circuit for cancelling the modulation in the IF output.

A particular example of the self-oscillating mixer circuit of FIGS. 1 and 2 in a simple short-range FMCW radar will now be described to illustrate further the practical aspects of the present invention. In this particular example the SOM 10 is modulated with a sawtooth waveform 40 to frequency sweep the oscillator, and RF signals which return to the RF antenna output R after being reflected from radar targets mix in the active FET device to give beat frequencies at the IF output 13. An harmonic-mode GaAs MESFET SOM 10 having a nominal centre frequency of 33.5 GHz was constructed with the tuned feedback circuit of FIG. 2. By varying the bias voltage of this MESFET SOM from 2.25 V to 3.25 V, for example, it was found that the RF frequency could be tuned over 660 MHz about the 33.5 MHz centre, while the RF output power varied by less than 1 dB over this range. The tuning characteristic is linear, which is a feature of harmonic-mode oscillators.

The variation in bias voltage can be achieved with a sawtooth generator 44. However, the modulating sawtooth waveform 40 typically is more than a hundred millivolt in amplitude and is imposed at the same point 13 in the SOM 10 as the IF beat frequencies which may be only a fraction of a millivolt in amplitude. Because of these large differences in amplitude and because of harmonics of the sweep waveform, it would be difficult to use filters in order to separate the IF beat signal and the modulating bias signal. However, this difficulty is avoided in the circuit of FIG. 1 in accordance with the present invention, by removing the known modulating waveform 40 from the modulated IF signal 41 so as to leave only the radar beat frequencies.

In the MESFET SOM FMCW radar circuit of FIGS. 1 and 2, the sweep waveform which appears at the gate connection 13 in this FET configuration is inverted with respect to the original modulating waveform on the FET drain. Consequently in the circuit of FIGS. 1 and 2, the addition of the modulated IF signal 41 with the sweep reference signal 40 leaves only the radar beat frequency at the IF output I. A 10 dB signal to noise ratio in a 1 kHz bandwidth can be obtained by operating the 33.5 GHz MESFET harmonic-mode SOM 10 in this manner in an FMCW radar with an RF output power of 1 mW and a 30 dB gain antenna (100 mm aperture) onto a target of 10 square meters RCS (radar cross section) at a range of 80 meters. Range resolutions of down to about 1 meter can be achieved due to the use of the harmonic-mode MESFET oscillator with its good tuning linearity with a sweep of, for example 150 MHz. Power consumption is also very low. In the particular example described, the circuit uses less than 100 mW in the RF parts and sweep modulator.

Thus, the present invention permits an extremely simple FMCW radar to be obtained, in which an antenna 21 is the only RF component which needs to be added. The self-oscillating mixer circuit constructed in accordance with the invention forms the complete front end of the FMCW radar. The invention also permits an extremely simple construction of the RF parts of the mixer circuit on a microstrip substrate, on which the buffer 25 and cancellation circuit 4 to 9 may also be formed and mounted in a very small and compact arrangement. The circuit and resulting radar is particularly suitable for very short range and high resolution sensing. Thus, low-cost circuits and radars in accordance with the present invention may be designed for collision avoidance or speedometer applications in cars or other vehicles.

Many modifications and variations are possible in circuits in accordance with the invention. FIG. 2 shows an advantageous common-source MESFET configuration in which the gate connection 13 is used for the IF output and the drain connection (15,1) is used for the modulation input and RF output and input. However a MESFET 30 may be used to form a SOM 10 in a different circuit configuration in which any one of the source, drain and gate may be used as terminals for the modulation input, IF output, and RF output/input. Thus, for example the IF output may be taken from the source of a MESFET 30 whose gate is connected to ground 22. An RF bipolar transistor may be used instead of the MESFET 30. In some of these circuit configurations, the modulation occurring in the IF output will not be inverted with respect to the modulating signal 40, and so a subtraction circuit is then used (instead of the summation circuit 6 to 9) to subtract the modulating signal 40 from the modulated IF output 41 and thereby to produce a substantially demodulated IF output signal I.

From reading the present disclosure, other variations and modifications will be apparent to persons skilled in the art. Such variations and modifications may involve equivalents and other features which are already known in the design, manufacture and use of oscillator and mixer circuits and component parts thereof, and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A circuit for producing an IF signal, said circuit comprising:
    a. a self-oscillating mixer for producing an RF signal, modulating the RF signal in response to a modulating signal, and mixing the modulated RF signal with a reflected return of said modulated signal, said mixer including:
        (1) an input for receiving the modulating signal;
        (2) an RF line for carrying the modulated RF signal and the reflected return;
        (3) an output for providing an IF signal resulting from said mixing; and
    b. cancellation means for combining the IF signal with the modulating signal to cancel from the IF signal a modulation corresponding to that of the modulated RF signal, said cancellation means including a first input coupled to the output of the mixer, a second input for receiving the modulating signal, and an output for producing a demodulated IF signal.

2. A circuit as in claim 1 where the corresponding modulation in the IF signal is inverted with respect to the modulating signal, and where the cancellation means comprises a summation circuit for adding the modulating signal to the IF signal.

3. A circuit as in claim 2 where the self-oscillating mixer includes an RF oscillator for producing the RF signal, said oscillator comprising a transistor which is electrically connected in a feedback path, the inversion of the IF signal being performed by said transistor.

4. A circuit as in claim 1 or 2 where the self-oscillating mixer includes a voltage controlled oscillator for producing the RF signal.

5. A circuit as in claim 4 where said oscillator comprises a field effect transistor which is electrically connected in a feedback path.

6. A circuit as in claim 5 where the output for providing the IF signal is electrically connected to a gate of the field effect transistor.

7. A circuit as in claim 1 or 2 including a buffer electrically connected between the input of the self oscillating mixer and a terminal to which the modulating signal is applied.

8. A frequency-modulated continuous-wave radar comprising an antenna, a sweep waveform generator for producing a modulating signal, and a circuit for producing an IF signal, said circuit comprising:
   a. a self-oscillating mixer for producing an RF signal, modulating the RF signal in response to the modulating signal, and mixing the modulated RF signal with a reflected return of said modulated signal, said mixer including:
      (1) an input electrically connected to the sweep waveform generator for receiving the modulating signal;
      (2) an RF line electrically connected to the antenna for carrying the modulated RF signal and the reflected return;
      (3) an output for providing an IF signal resulting from said mixing; and
   b. cancellation means for combining the IF signal with the modulating signal to cancel from the IF signal a modulation corresponding to that of the modulated RF signal, said cancellation means including a first input coupled to the output of the mixer, a second input electrically connected to the sweep waveform generator for receiving the modulating signal, and an output for producing a demodulated IF signal.

* * * * *